(12) United States Patent
Kadota et al.

(10) Patent No.: US 9,848,520 B2
(45) Date of Patent: Dec. 19, 2017

(54) COMPONENT MOUNTING APPARATUS

(71) Applicant: PANASONIC INTELLECTUAL PROPERTY MANAGEMENT CO., LTD., Osaka (JP)

(72) Inventors: Syozo Kadota, Yamanashi (JP); Yasuyuki Ishitani, Yamanashi (JP); Tadashi Endo, Yamanashi (JP); Tomoo Hama, Yamanashi (JP); Toshihiko Nagaya, Yamanashi (JP); Hiroshi Okamura, Yamanashi (JP); Hiroyuki Fujiwara, Yamanashi (JP); Makoto Nakashima, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 202 days.

(21) Appl. No.: 14/860,850

(22) Filed: Sep. 22, 2015

(65) Prior Publication Data

US 2016/0120037 A1    Apr. 28, 2016

(30) Foreign Application Priority Data

Oct. 27, 2014   (JP) .................................. 2014-217965

(51) Int. Cl.
  *B23P 19/00*   (2006.01)
  *H05K 13/04*   (2006.01)
(52) U.S. Cl.
  CPC .............................. *H05K 13/0417* (2013.01)

(58) Field of Classification Search
  CPC ........................... H05K 13/0417; H05K 3/301
  See application file for complete search history.

(56) References Cited

U.S. PATENT DOCUMENTS

| | | | | |
|---|---|---|---|---|
| 6,345,728 | B1 * | 2/2002 | Kawaguchi | .......... H05K 13/021 |
| | | | | 221/239 |
| 8,881,383 | B2 * | 11/2014 | Kitagawa | ........... H05K 13/0452 |
| | | | | 29/469 |
| 8,881,384 | B2 * | 11/2014 | Kitagawa | ........... H05K 13/0413 |
| | | | | 29/469 |
| 8,950,064 | B2 * | 2/2015 | Kitagawa | ........... H05K 13/0452 |
| | | | | 29/469 |
| 2013/0000114 | A1 | 1/2013 | Kitagawa et al. | |
| 2015/0237772 | A1 * | 8/2015 | Nozawa | ............... H05K 13/021 |
| | | | | 29/703 |

FOREIGN PATENT DOCUMENTS

JP       2012-151332 A      8/2012

* cited by examiner

*Primary Examiner* — Paul D Kim
(74) *Attorney, Agent, or Firm* — Pearne & Gordon LLP

(57) ABSTRACT

A component mounting apparatus includes a carriage that holds a part feeder for supplying a component in a state of being attached to a base and attaches the part feeder to the base in a state of being coupled to the base; a mounting head that mounts the component to a substrate after the component is taken out of the part feeder held by the carriage coupled to the base through an opening formed between the base and a cover member formed so as to cover an upward side of the base; and a shutter moved from an opened position in which the opening is opened to a closed position in which the opening is closed when the carriage is separated from the base.

5 Claims, 11 Drawing Sheets

COMPONENT MOUNTING APPARATUS

CROSS-REFERENCES TO RELATED APPLICATION(S)

This application is based on and claims priority from Japanese Patent Application No. 2014-217965 filed on Oct. 27, 2014, the entire contents of which are incorporated herein by reference.

BACKGROUND

1. Field of the Invention

One or more embodiments of the present invention relate to a component mounting apparatus for mounting an electronic component on a substrate.

2. Description of Related Art

A component mounting apparatus includes a part feeder for supplying a component in a state being attached to a base, and a mounting head for taking the component out of the part feeder attached to the base and mounting the component on a substrate. The part feeder is held in a carriage capable of being coupled to and separated from the base, and the part feeder can be attached to the base by coupling the carriage to the base. An opening is formed between the base and a cover member formed so as to cover an upward side of the base, and the mounting head takes the component out of the part feeder held by the carriage through the opening.

When the carriage is separated from the base in such a component mounting apparatus, a cavity formed in the end of the base is exposed. The cavity communicates with a movable region of the mounting head through the opening. As a result, an unsafe state occurs, for example, an operator accidentally touches the mounting head in motion. In order to prevent such an unsafe state, when the carriage is separated from the base, operation of the mounting head is stopped to maintain a safe state of the operator. A component mounting apparatus capable of attachment of a carriage to each of one side and the other side opposed in a base is constructed so that when the carriage is detached from one side of the base, component supply from the carriage of the other side of the base is stopped and also operation of a mounting head is stopped completely (see Patent Reference 1, for instance).

Patent Reference 1 is JP-A-2012-151332.

SUMMARY

However, even when the carriage holding the part feeder is separated from one side of the base, the mounting head of the side of the separated carriage can be operated as long as the safe state of the operator can be ensured.

Hence, an object of the embodiments of the invention is to provide a component mounting apparatus capable of continuing operation of a mounting head while ensuring a safe state of an operator even when a carriage holding a part feeder is separated from a base.

A component mounting apparatus of the embodiments of the invention includes a carriage that holds a part feeder for supplying a component in a state of being attached to a base and attaches the part feeder to the base in a state of being coupled to the base; a mounting head that mounts the component to a substrate after the component is taken out of the part feeder held by the carriage coupled to the base through an opening formed between the base and a cover member formed so as to cover an upward side of the base; and a shutter moved from an opened position in which the opening is opened to a closed position in which the opening is closed when the carriage is separated from the base.

According to the embodiments of the invention, operation of the mounting head can be continued while ensuring a safe state of an operator even when the carriage holding the part feeder is separated from the base.

DETAILED DESCRIPTION

Figure 1A:
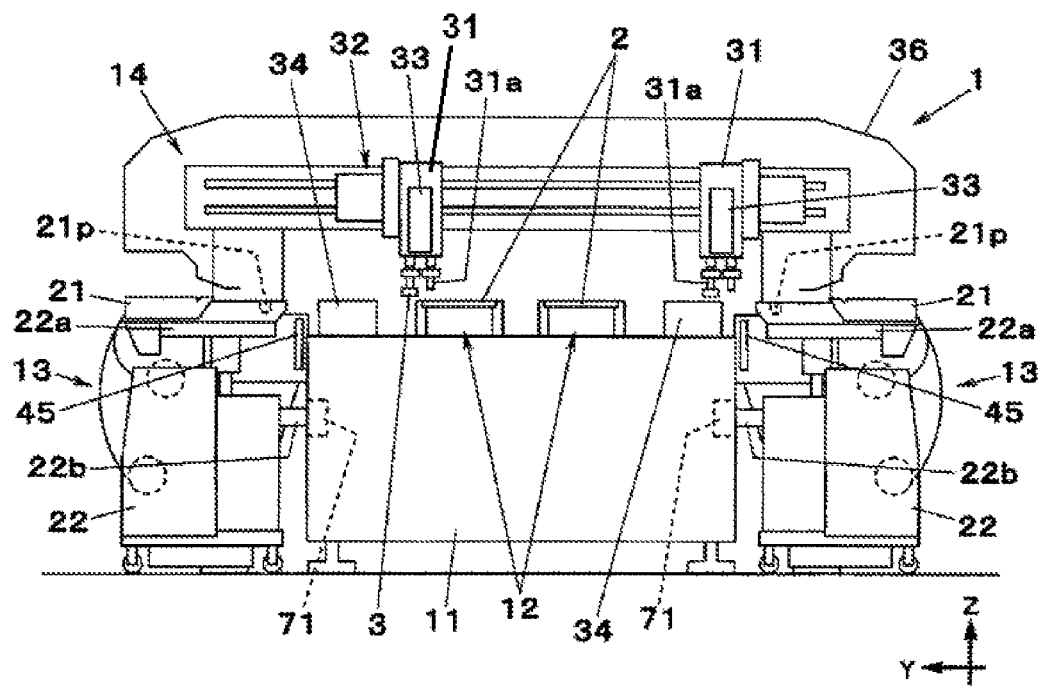
FIGS. 1A and 1B are a side view and a plan view of a component mounting apparatus in an embodiment of the invention.
Figure 1B:
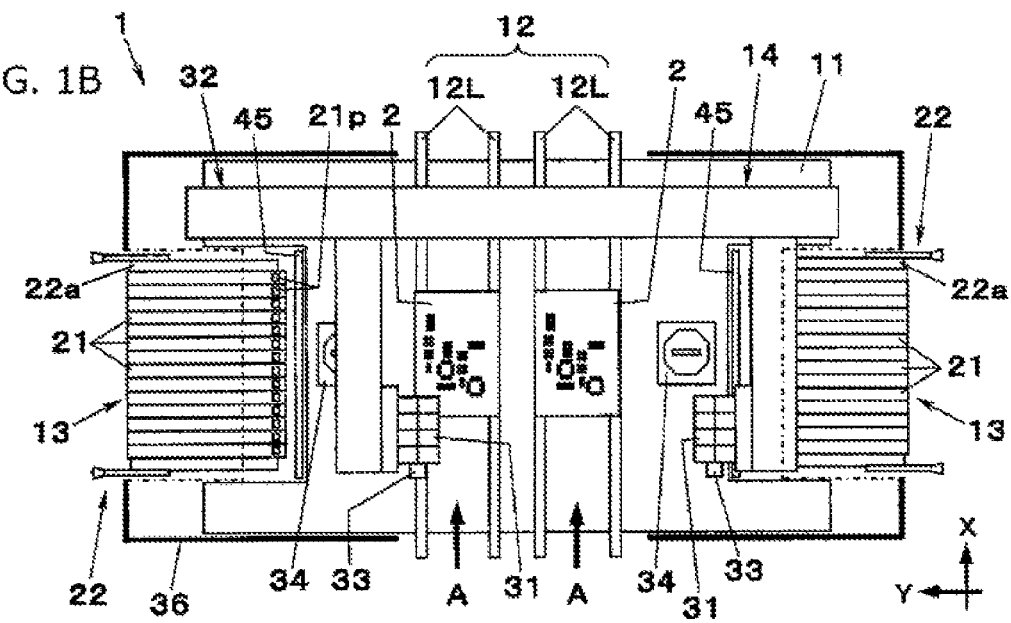
Figure 2:
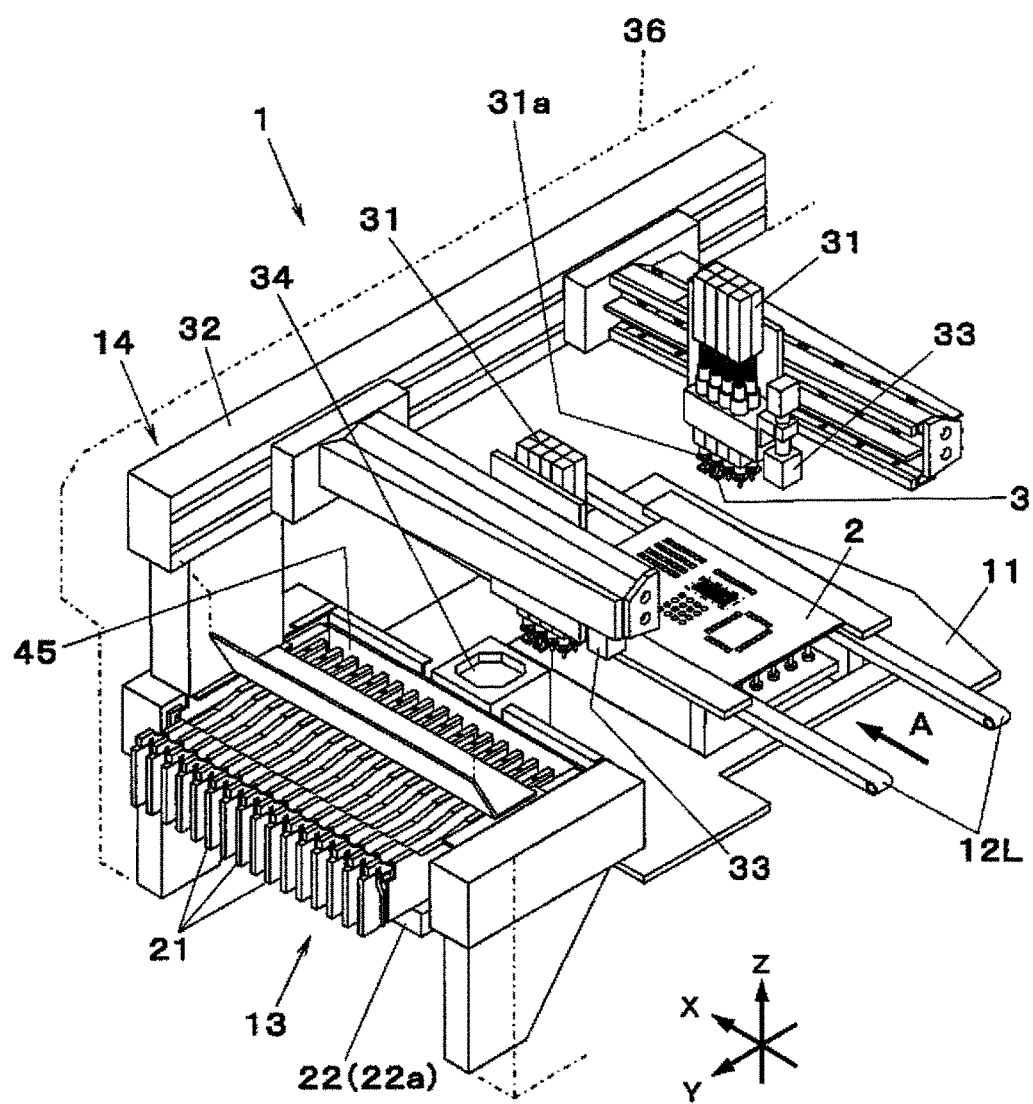
FIG. 2 is a main perspective view of the component mounting apparatus in the embodiment of the invention.

An embodiment of the invention will hereinafter be described with reference to the drawings. A component mounting apparatus 1 illustrated in FIGS. 1A, 1B and 2 illustrates an embodiment of the invention. The component mounting apparatus 1 includes a substrate conveyance part 12, a component supply part 13 and a component mounting part 14 on a base 11, and repeatedly executes operation of mounting components 3 on a substrate 2. Here, for convenience of description, a conveyance direction (arrows A illustrated in FIGS. 1B and 2) of the substrate 2 by the substrate conveyance part 12 is set in an X-axis direction (a left-right direction viewed from an operator), and a direction (a front-back direction viewed from the operator) in a horizontal plane orthogonal to the X-axis direction is set in a Y-axis direction. Also, a vertical direction is set in a Z-axis direction.

In FIGS. 1A, 1B and 2, the substrate conveyance part 12 includes two sets of front-back substrate conveyance lanes 12L for receiving the substrate 2 delivered from another apparatus of the upstream process side and conveying the substrate 2 in the X-axis direction. The component supply part 13 includes one or more part feeders 21 attached to two places opposed in the front-back direction of the base 11, and carriages 22 for attaching and holding these part feeders 21 to feeder bases 22a. The part feeders 21 held in the carriage 22 can collectively be attached to or detached from the base 11 by coupling or separating the carriage 22 to or from one side or the other side opposed in the front-back direction of the base 11. The part feeder 21 is configured of, for example, a tape feeder, and supplies the component 3 to a component supply port 21p in a state attached to the base 11.

The component mounting part 14 includes two mounting heads 31 opposed in the front-back direction of the base 11, and a head movement mechanism 32 for moving these two mounting heads 31 mutually independently in the horizontal plane. Each of the mounting heads 31 includes plural suction nozzles 31a for sucking the components 3 supplied by the part feeder 21 attached to the base 11.

Each of the two mounting heads 31 is provided with a substrate camera 33 with an imaging visual field facing downwardly. Each of the substrate cameras 33 is moved integrally to the mounting head 31, and images a mark (not illustrated) formed on the substrate 2 positioned in a work position by the substrate conveyance lanes 12L.

Positions (two places) between the substrate conveyance parts 12 and the part feeders 21 attached to the base 11 are provided with component cameras 34. In each of the component cameras 34, an imaging visual field faces upwardly, and the components 3 sucked by the suction nozzles 31a of the mounting head 31 is imaged from a downward side.

The base 11 is provided with a safety cover 36 (cover member) for covering an upward region (movable region of the two mounting heads 31) of the base 11. A part of the safety cover 36 can be opened and closed. The operator can access the substrate conveyance part 12, the mounting head 31, etc. by opening the part of the safety cover 36 in a state in which movement of the mounting head 31 by the head movement mechanism 32 is stopped.

Figure 3A:
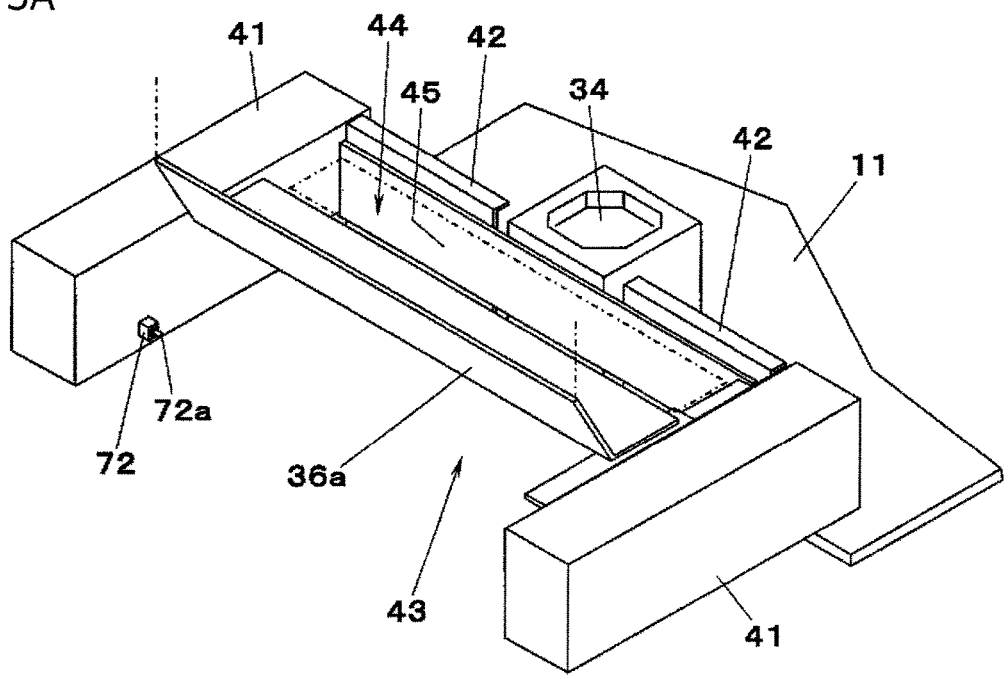
FIGS. 3A and 3B are partial perspective views of the component mounting apparatus in the embodiment of the invention.
Figure 3B:
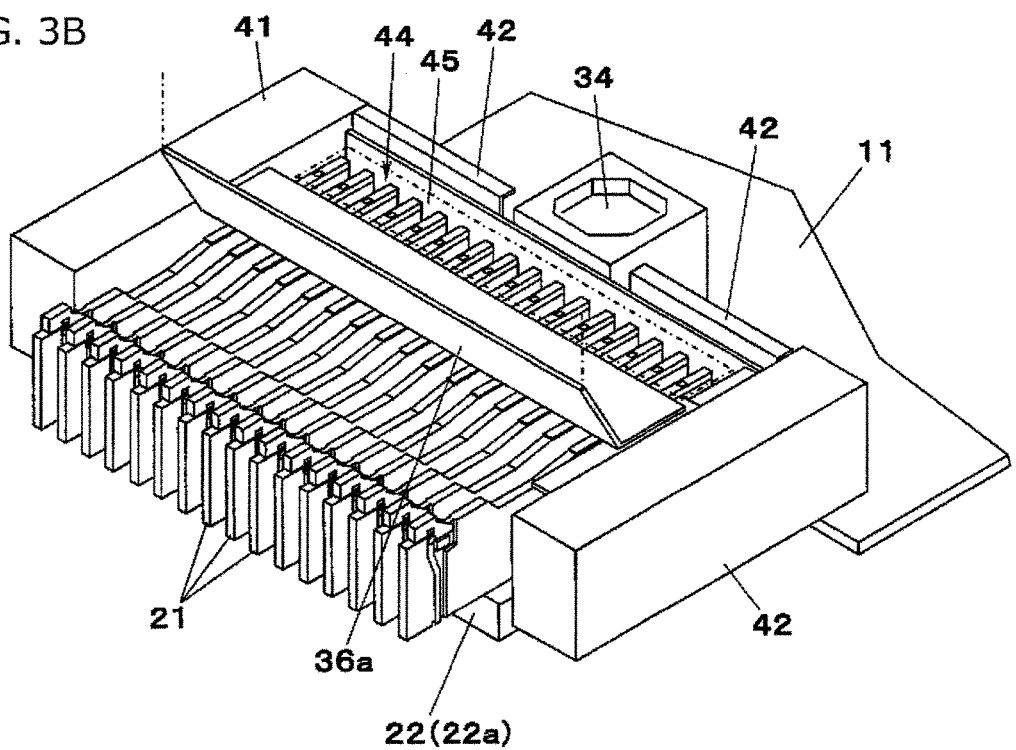

In FIGS. 3A and 3B, in the front and the back of the base 11, carriage insertion parts 43 with recessed shapes in plan view are formed by box parts 41 arranged in both left and right sides and left-right partition walls 42 arranged between the box parts 41 and extending in the left-right direction in a vertical plane. A part (an overhang portion 36a) of the safety cover 36 overhangs over each of the carriage insertion parts 43, and a rectangular opening 44 is formed by the overhang portion 36a of this safety cover 36, the left-right box parts 41 and the partition walls 42. When the carriage 22 is inserted into the carriage insertion part 43 and is coupled to the base 11 (FIG. 3B), the feeder base 22a is attached to the base 11, and each of the part feeders 21 held in the feeder base 22a is positioned with respect to the base 11. Accordingly, the component supply port 21p of each of the part feeders 21 is positioned just under the opening 44.

Figure 4A:
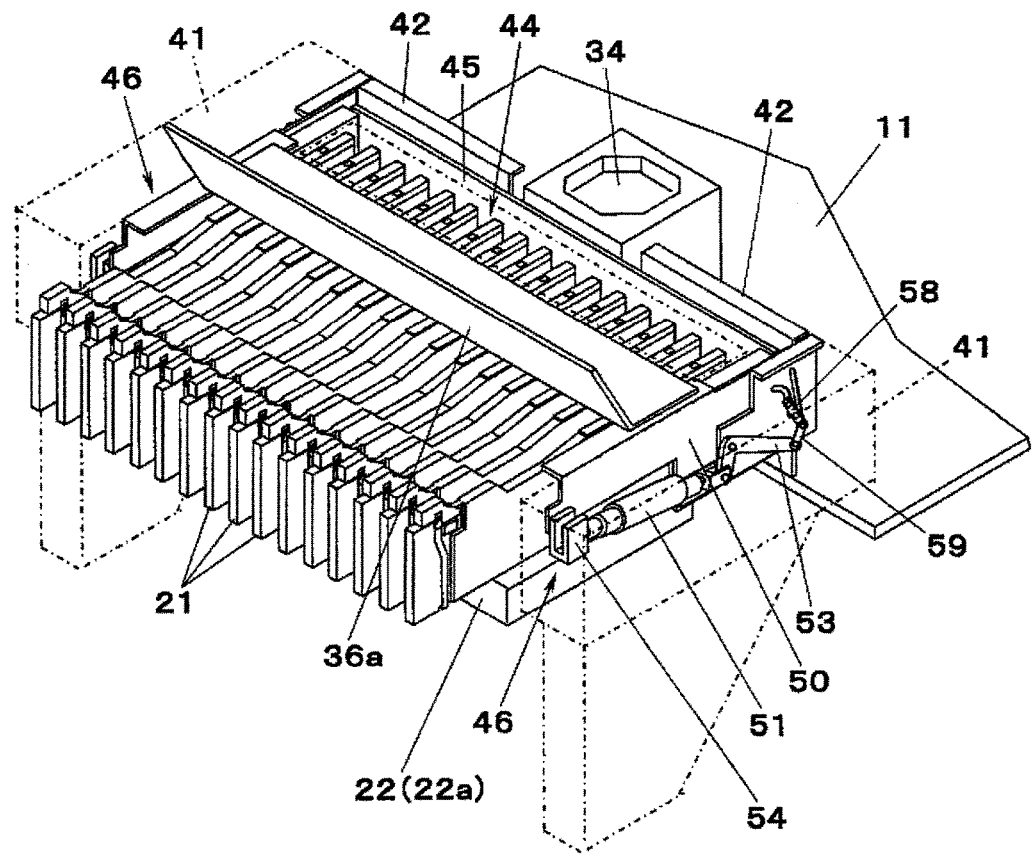
FIGS. 4A and 4B are a partial perspective view and a partial side view of the component mounting apparatus in the embodiment of the invention.
Figure 4B:
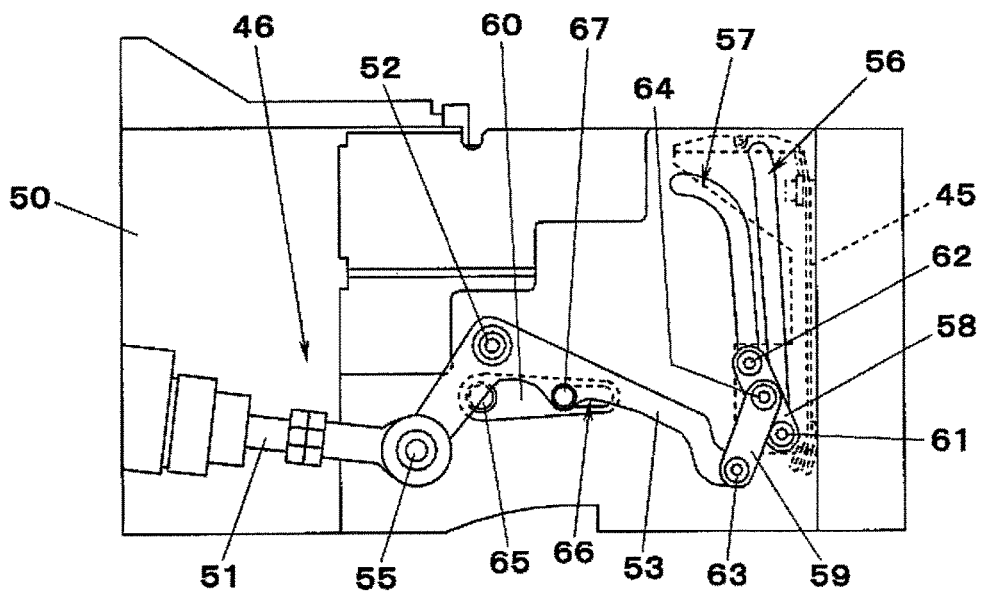
Figure 5A:
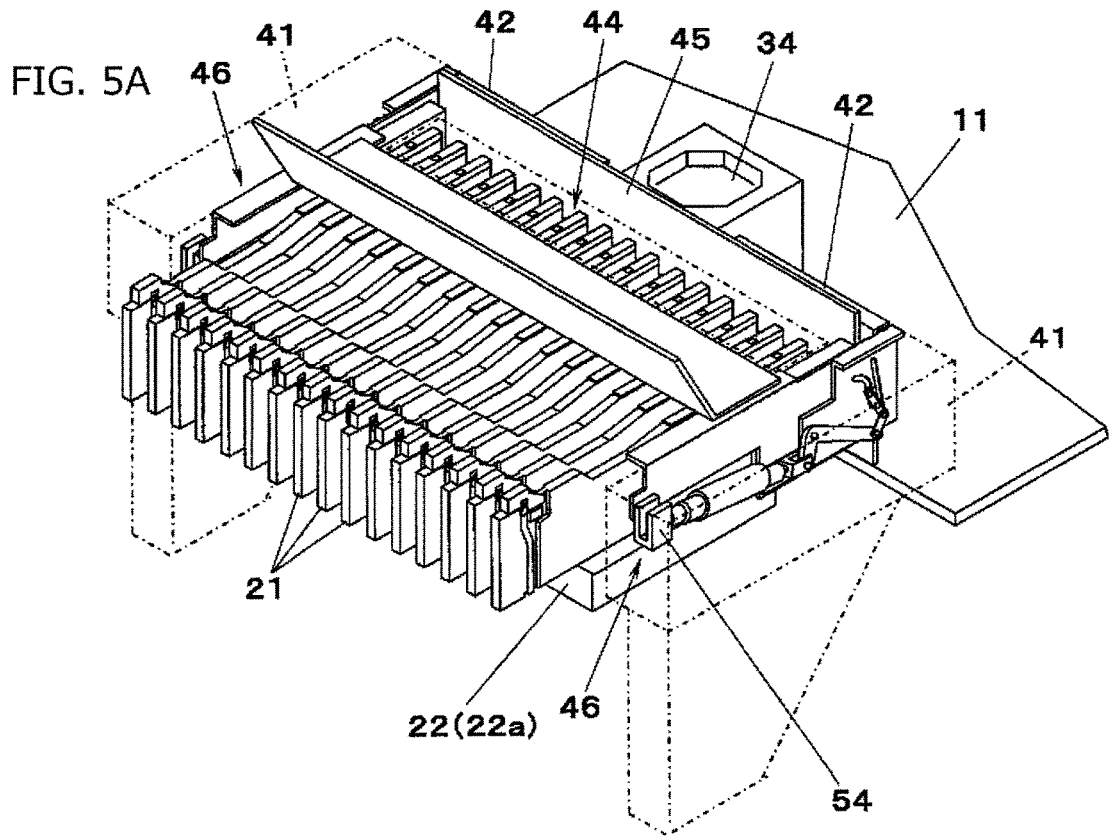
FIGS. 5A and 5B are a partial perspective view and a partial side view of the component mounting apparatus in the embodiment of the invention.
Figure 5B:
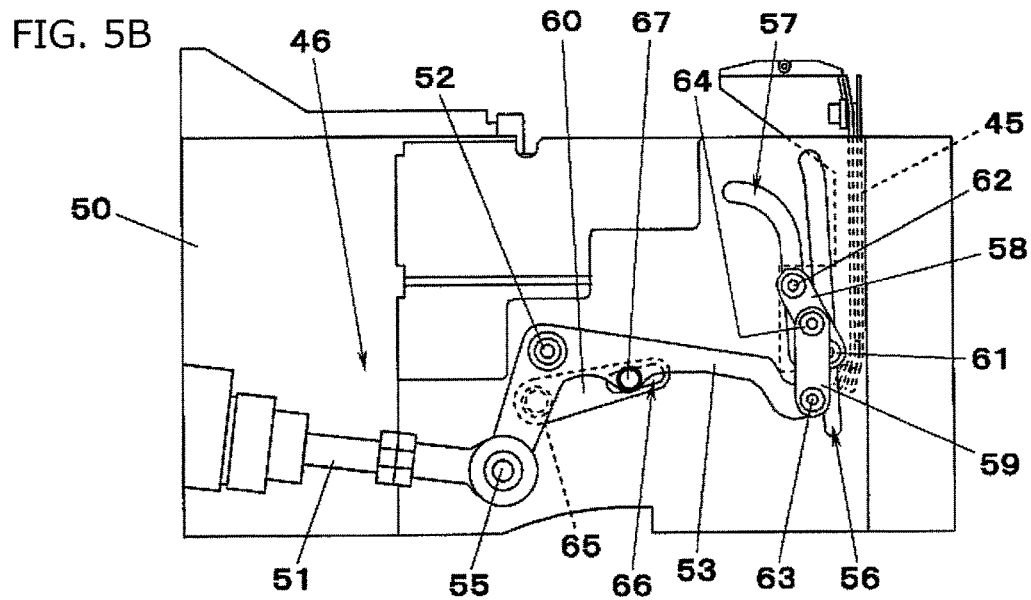
Figure 6A:
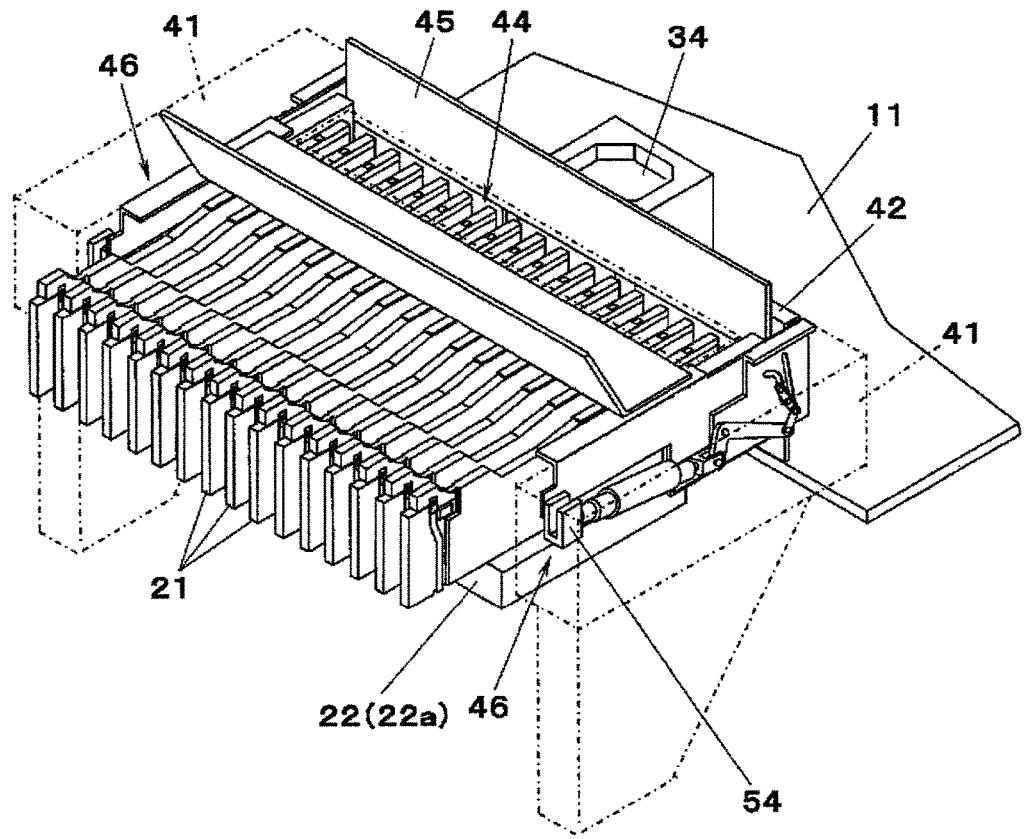
FIGS. 6A and 6B are a partial perspective view and a partial side view of the component mounting apparatus in the embodiment of the invention.
Figure 6B:
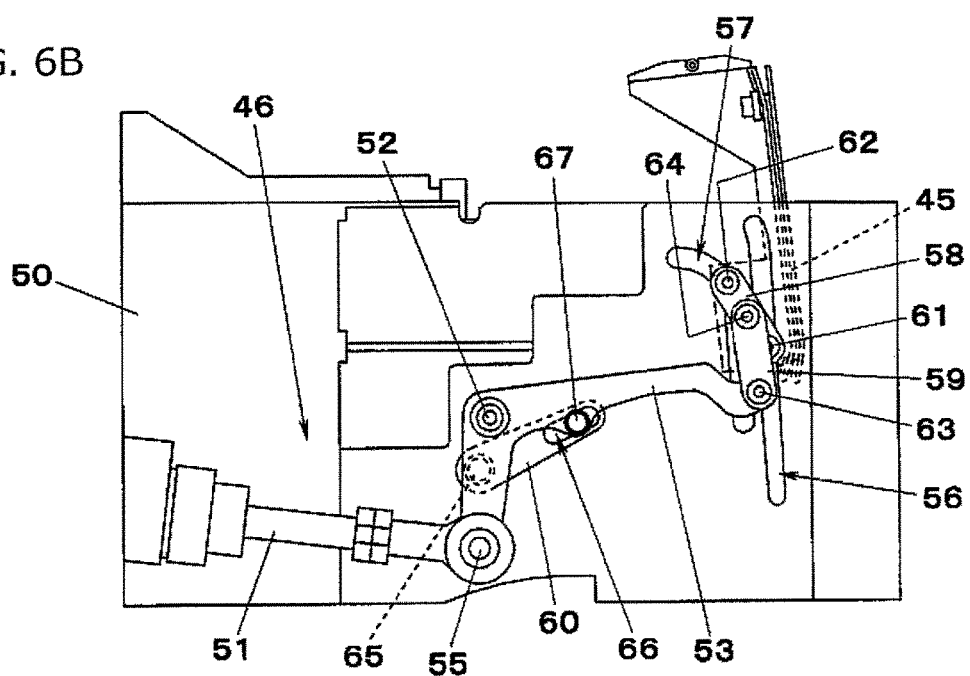
Figure 7A:
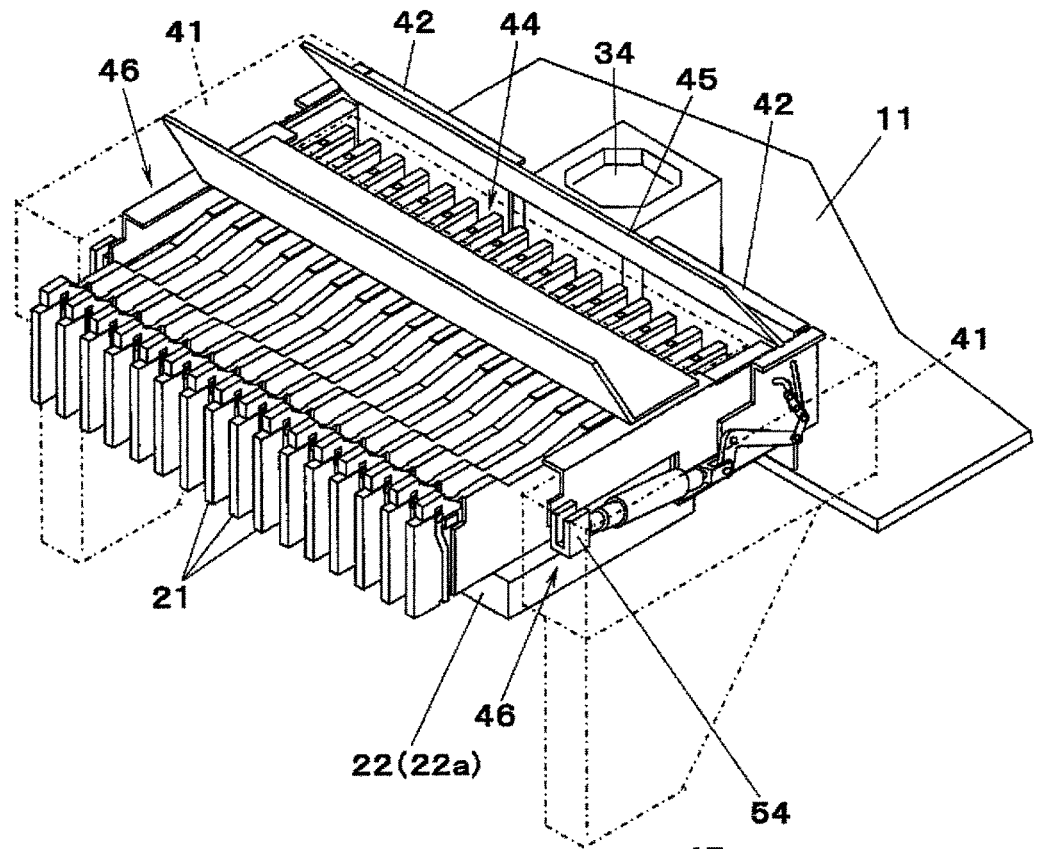
FIGS. 7A and 7B are a partial perspective view and a partial side view of the component mounting apparatus in the embodiment of the invention.
Figure 7B:
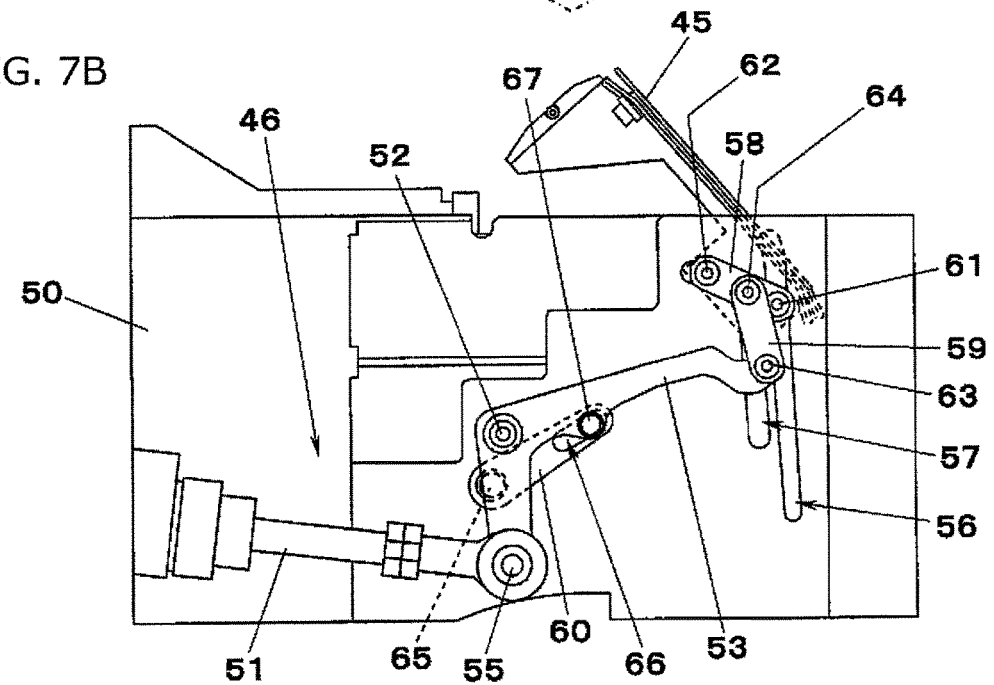

In FIGS. 4A and 4B, a region of a side opposed to the carriage 22 in the partition walls 42 is provided with a shutter 45 configured of a plate-shaped member in substantially a vertical posture extending in the left-right direction, and shutter driving mechanisms 46 are housed inside the left-right box parts 41. The shutter driving mechanisms 46 move the shutter 45 between an "opened position" in which the opening 44 is opened with the shutter 45 in substantially the vertical posture and a "closed position" in which the opening 44 is closed with the shutter 45 in substantially a horizontal posture.

In FIGS. 4A and 4B, the shutter driving mechanism 46 has a base member 50 extending in the front-back direction, a cylinder 51 formed to the outside of the base member 50 so as to extend in the front-back direction, and an L-shaped arm member 53 whose center is supported by a first pin 52 attached to the base member 50. Here, a surface in which the partition wall 42 of a cavity inserted into the base 11 is arranged is set as a back side, and a side opposite to the back side is set as a front side. In the cylinder 51, the end of the surface of the front side is supported by a cylinder support member 54 formed on the base member 50, and the end of the surface of the back side is coupled to the end of the front side of the arm member 53 by a second pin 55.

Also, the shutter driving mechanism 46 has a first guide groove 56, a second guide groove 57, a first link member 58, a second link member 59, and a third link member 60. The first guide groove 56 is formed in a position of the back side of the base member 50 so as to extend in the vertical direction, and the second guide groove 57 is formed in a position of the front side beyond the first guide groove 56 of the base member 50 so as to extend in the vertical direction. The upper end of the second guide groove 57 is bent to the front side.

In FIG. 4B, the first link member 58 has a linear shape, and a second pin 61 formed on one end side is positioned inside the first guide groove 56 and also, a third pin 62 formed on the other end side is positioned inside the second guide groove 57. The lower end of the shutter 45 positioned in the opened position is coupled to the first link member 58. The second link member 59 has a linear shape extending in substantially the vertical direction, and a fourth pin 63 formed on the lower end is coupled to the end of the back side of the arm member 53 and also, a fifth pin 64 formed on the upper end is coupled to an intermediate part of the first link member 58. The third link member 60 is coupled to a sixth pin 65 whose one end side is formed on the base member 50, and a seventh pin 67 formed on an intermediate part of the arm member 53 is positioned inside an elongated hole 66 formed in the other end side.

Figure 8A:
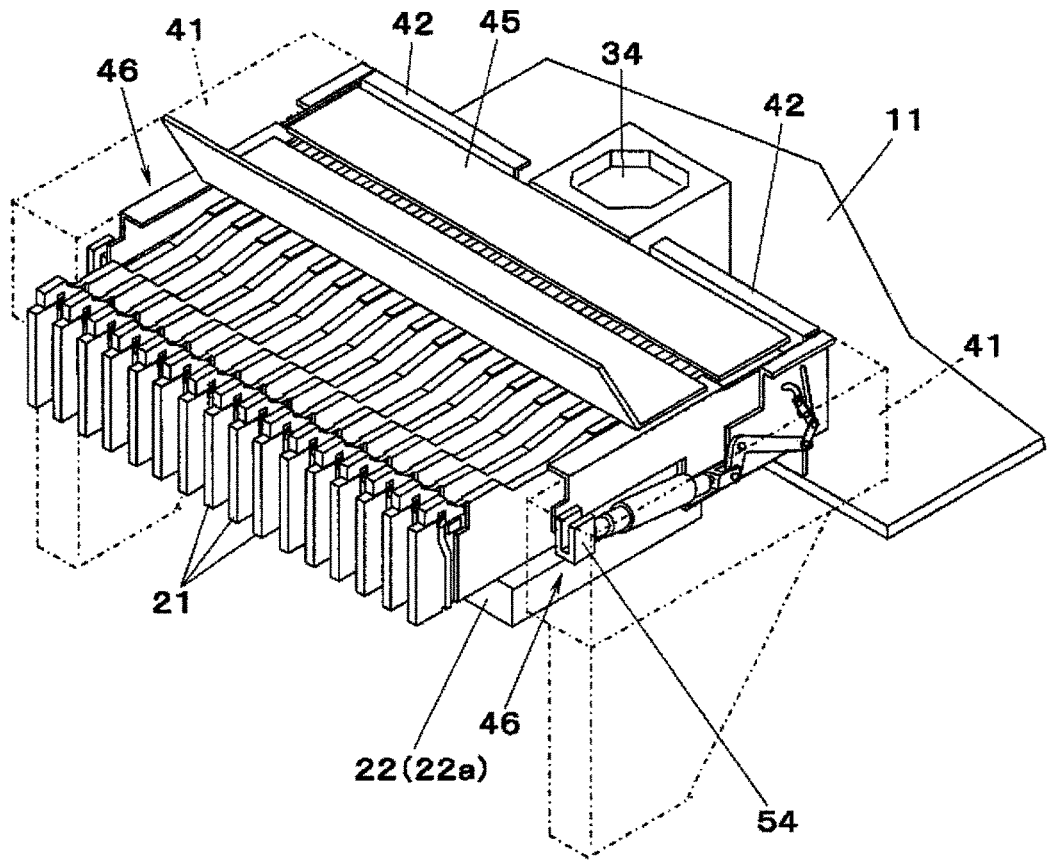
FIGS. 8A and 8B are a partial perspective view and a partial side view of the component mounting apparatus in the embodiment of the invention.
Figure 8B:
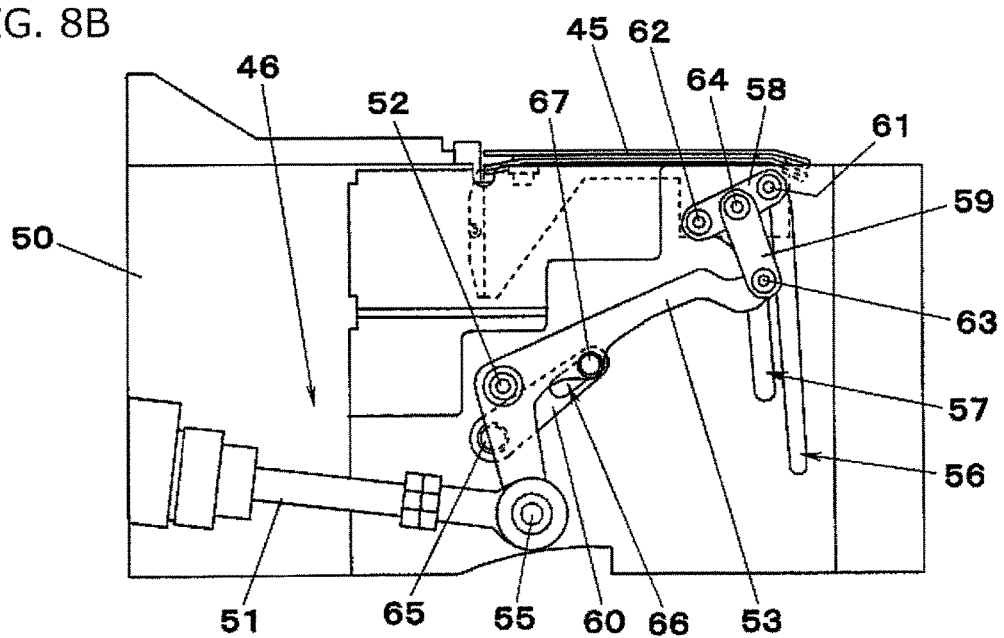

When the cylinder 51 is extended from a state (FIGS. 4A and 4B) in which the shutter 45 is in the opened position, the arm member 53 is swung around the first pin 52 to thereby push up the first link member 58 through the second link member 59. At this time, the second pin 61 formed on one end side of the first link member 58 is upwardly moved along the first guide groove 56, and the third pin 62 formed on the other end side is upwardly moved along the second guide groove 57 (FIGS. 4A and 4B, FIGS. 5A and 5B). Since the shutter 45 is attached to the first link member 58 and the upper end of the second guide groove 57 is bent toward the front side as described above, when the first link member 58 is upwardly moved further by extension of the cylinder 51, the whole shutter 45 is accordingly swung so as to fall to the front side (FIGS. 5A and 5B, FIGS. 6A and 6B, FIGS. 7A and 7B) and finally, the shutter 45 takes the horizontal posture and is positioned in the closed position (FIGS. 8A and 8B). On the other hand, when the cylinder 51 is contracted from a state in which the shutter 45 is in the closed position, the shutter 45 is moved and is positioned in the opened position in a reverse path to a path at the time of the extension of the cylinder 51.

In the embodiment, the shutter 45 is configured of the plate-shaped member and is substantially in the horizontal posture in the closed position and is substantially in the vertical posture in the opened position. Accordingly, a range of movement of the shutter 45 can be limited to a narrow region, and the shutter 45 and its driving mechanism (shutter driving mechanism 46) can be formed in a compact configuration.

Figure 9:
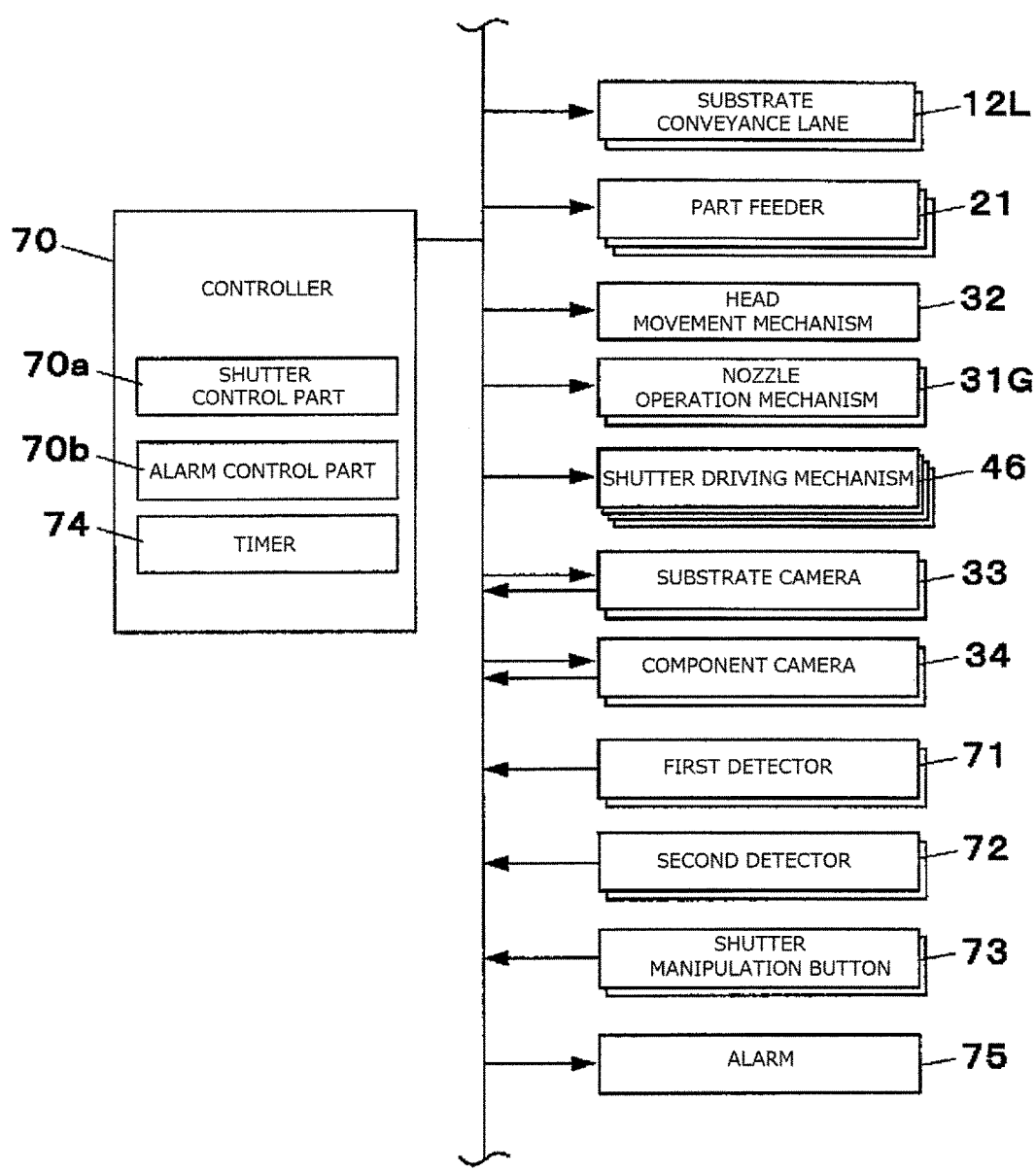
FIG. 9 is a block diagram illustrating a control system of the component mounting apparatus in the embodiment of the invention.
Figure 10A:
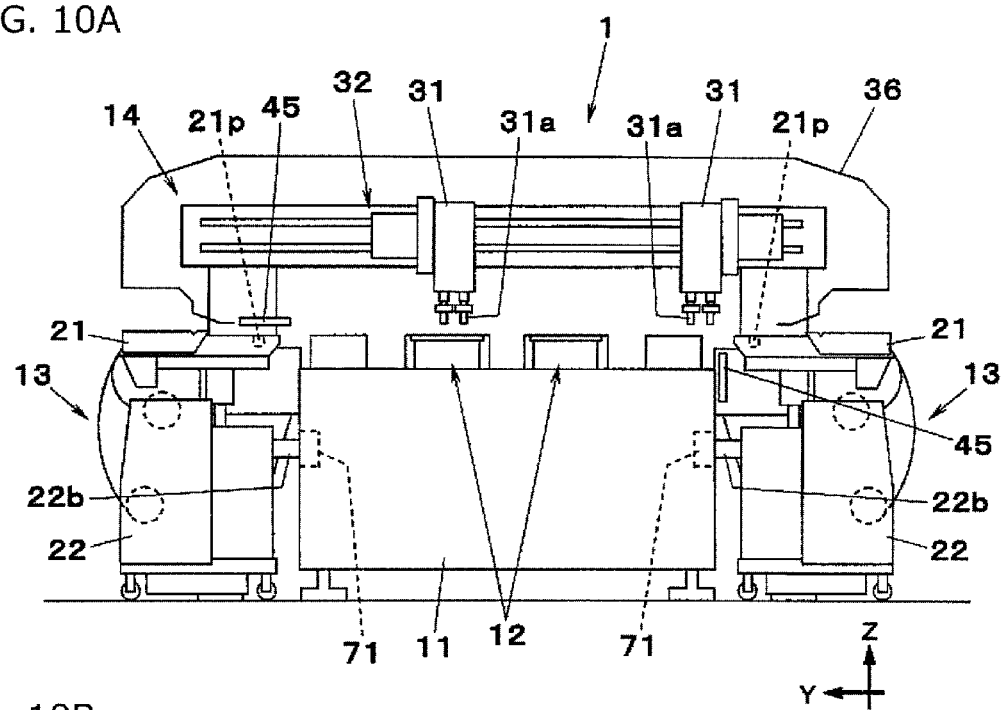
FIGS. 10A and 10B are a side view and a plan view of the component mounting apparatus in the embodiment of the invention.
Figure 10B:
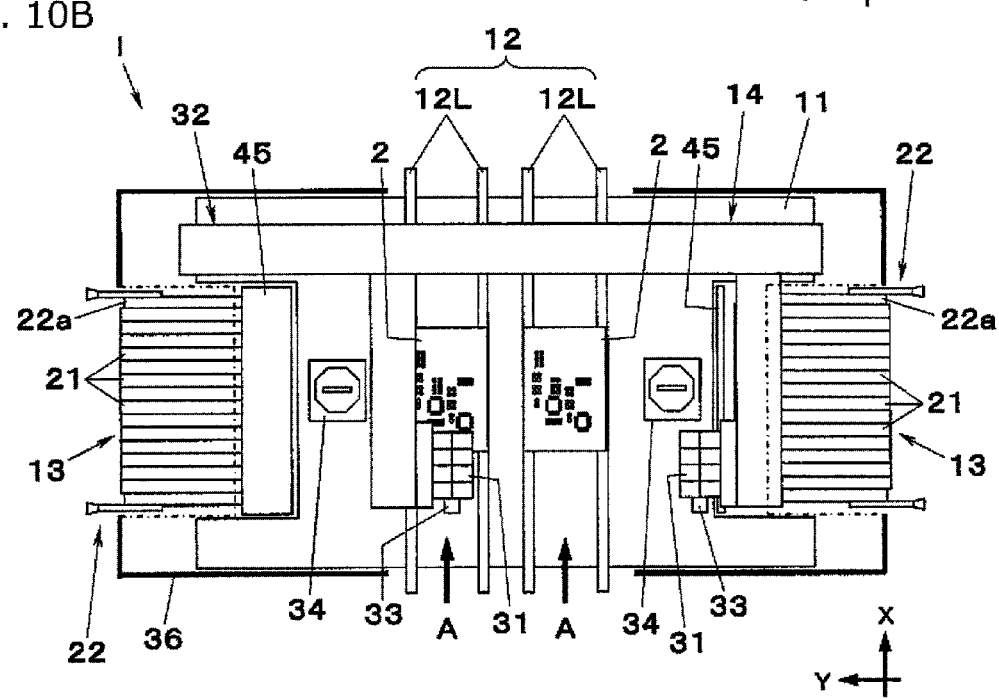

In FIG. 9, a controller 70 controls operation of the substrate conveyance lanes 12L, the part feeders 21, the head movement mechanism 32 and a nozzle operation mechanism 31G in order to mount the component 3 in the substrate 2 and convey the substrate 2. Also, the controller 70 has a shutter control part 70a for controlling driving of each of the opposed shutters 45 formed in the front and the back of the base 11. The shutter control part 70a controls operation of the shutter driving mechanism 46 corresponding to each of the shutters 45.

In FIG. 1A, first detectors 71 (first detecting unit) are formed in positions of the front and the back of the base 11. These first detectors 71 detect a state in which the carriage 22 is coupled to the base 11 by being fitted into a protrusion 22b formed on the carriage 22. A detection signal of the first detector 71 is inputted to the shutter control part 70a of the controller 70 (FIG. 9). The first detector 71 also functions as a separation detector for detecting a state in which the carriage 22 coupled to the base 11 is separated from the base 11.

In FIG. 3A, a second detector 72 (second detecting unit) is formed in a position of contact between the box part 41 and the carriage 22. The second detector 72 detects coupling and separation by turning on and off a mechanical switch such as a micro switch in the embodiment. The second detector 72 detects coupling of the carriage 22 by turning on the switch by pressing through contact between the carriage 22 and an actuator part 72a of the second detector 72. Also, the second detector 72 detects separation of the carriage 22 by turning off the switch by separating the pressed actuator part of the second detector 72.

In FIG. 9, each of the front and the back of the safety cover 36 is provided with a shutter manipulation button 73. When an operator manipulates the front or back shutter manipulation button 73, the shutter control part 70a of the controller 70 actuates the shutter driving mechanism 46 corresponding to the shutter manipulation button 73 on the manipulated side, and moves the shutter 45 from the opened position to the closed position or from the closed position to the opened position.

A series of operations in the case of separating the carriage 22 from the base 11 in order to replace the part feeders 21 attached to one side or the other side opposed in the front-back direction of the base 11 because of type switching etc. of the substrate 2 by an operator will be described. The operator manipulates the shutter manipulation button 73 of the side corresponding to the part feeders 21 to be replaced. Accordingly, the shutter control part 70a actuates the shutter driving mechanism 46, and moves the shutter 45 from the opened position to the closed position. Accordingly, the shutter 45 closes the opening 44 which is a path at the time of upward and downward movement of the suction nozzles 31a at the time when the mounting head 31 positioned over the part feeders 21 sucks the components 3 (FIGS. 8A and 8B, and FIGS. 10A and 10B). Thus, in the embodiment, when the carriage 22 is detached from the base 11, the shutter 45 is moved from the opened position in which the opening 44 is opened to the closed position in which the opening 44 is closed.

Figure 11:
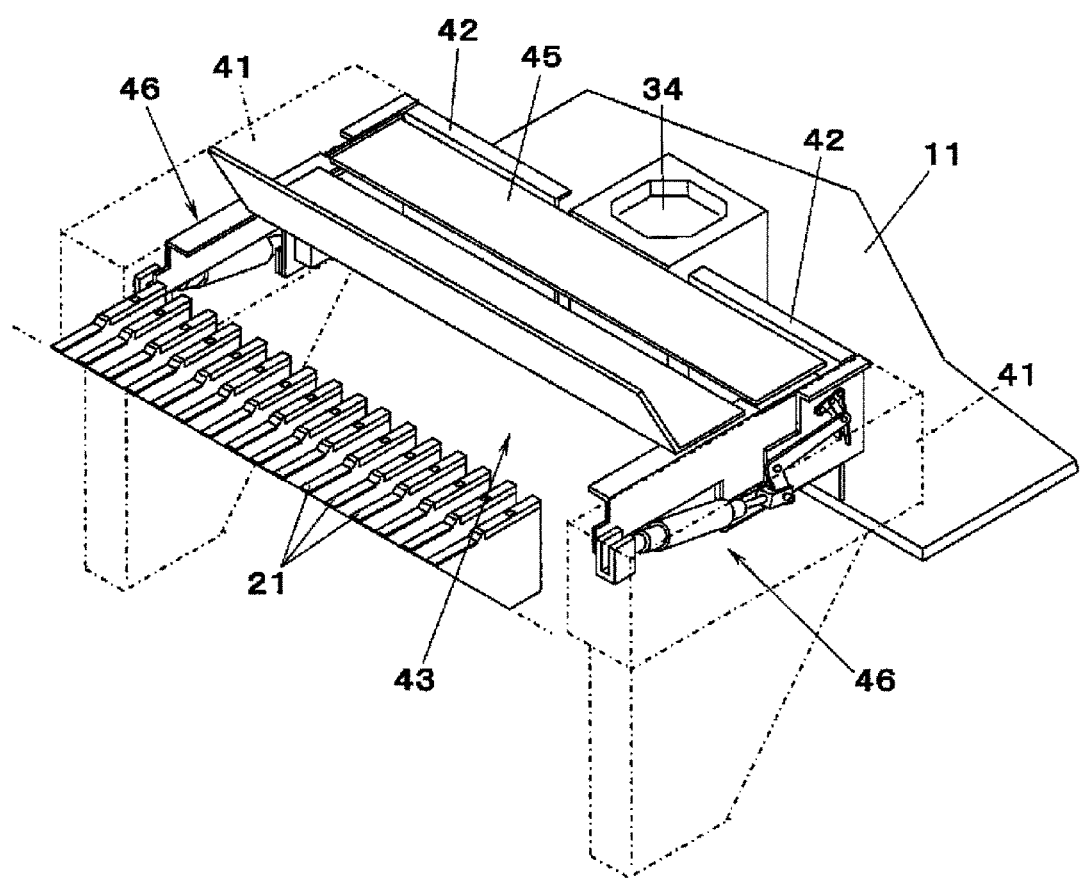
FIG. 11 is a partial perspective view of the component mounting apparatus in the embodiment of the invention.

After the operator detaches the carriage 22 from the base 11 and attaches the part feeders 21 for supplying components 3 after type switching to the feeder base 22a, the operator again couples the carriage 22 to the base 11. During this work, the opening 44 remains closed by the shutter 45 (FIG. 11). As a result, even when a cavity at the back of the carriage insertion part 43 is formed in the end of the base 11 by separating the carriage 22 from the base 11, there is no fear that the operator puts the hand in the movable region of the mounting head 31 from the cavity through the opening 44.

When the carriage 22 is again coupled to the base 11, the part feeders 21 corresponding to the components 3 after type switching are set in the movable region of the mounting head 31. After the carriage 22 is coupled to the base 11, the operator manipulates the shutter manipulation button 73. Accordingly, the shutter control part 70a actuates the shutter driving mechanism 46, and positions the shutter 45 from the closed position to the opened position. Accordingly, the opening 44 changes into an opened state, and the mounting head 31 can suck the components 3 supplied by the part feeders 21 after replacement.

In the component mounting apparatus 1 in the embodiment, a safe state of the operator can be ensured in a state in which the carriage 22 is detached from the base 11 as described above. As a result, even when the carriage 22 coupled to one side in the front-back direction of the base 11 is separated from the base 11, production of the substrate 2 can be continued by continuing supply of the component 3 from the part feeder 21 attached to the carriage 22 coupled to the other side in the front-back direction of the base 11 and mounting operation of the component 3 by the mounting head 31 for taking out the component 3 supplied by the part feeder 21 and mounting the component 3 to the substrate 2.

Next, a modified example of shutter control by the controller 70 in the embodiment will be described. The above example illustrates the example in which the operator manipulates the shutter manipulation button 73 (that is, by hand) to thereby move the shutter 45 from the opened position to the closed position or from the closed position to the opened position, but in the modified example, a safe state may be maintained by interlocking movement of the carriage 22 with operation of the shutter 45. Hereinafter, description of a configuration overlapping with that of the embodiment is omitted.

First, a series of operations in which the carriage 22 of one side or the other side is separated from the base 11 will be described. An operator moves the carriage 22 coupled to the base 11 in a separation direction, and separates the carriage 22 from the base 11. When the first detector 71 detects a state in which the carriage 22 is separated from the base 11, the shutter control part 70a actuates the shutter driving mechanism 46. Then, with movement of the shutter 45 from the opened position to the closed position, the operator completely separates the carriage 22 from the base 11.

Here, while the movement of the shutter 45 to the closed position is completed, the opening 44 remains opened. In other words, when the carriage 22 is completely separated from the base 11 before the movement of the shutter 45 to the closed position is completed, the hand may be put in the movable region of the mounting head 31 through the opening 44. As a result, the controller 70 needs to interlock movement of the carriage 22 with operation of the shutter 45. The shutter control of the controller 70 will hereinafter be described.

The controller 70 makes a transition from a safe state to an unsafe state when the first detector 71 detects separation of the carriage 22, and makes a transition from the unsafe state to the safe state when the first detector 71 detects coupling of the carriage 22. The controller 70 detects that the shutter 45 is moved to the closed position or the opened position. Also, the controller 70 includes a timer 74 (FIG. 9) for maintaining the safe state for a certain time so as not to stop operation of the mounting head 31 when the first detector 71 detects separation of the carriage 22. The timer 74 starts measurement after the first detector 71 detects separation of the carriage 22 from the base 11. For a certain time (about several seconds) since the start of the measurement of the timer 74, the controller 70 is maintained in the safe state. In addition, the controller 70 operates the mounting head 31 in the case of the safe state, and stops the mounting head 31 in the case of the unsafe state.

When the first detector 71 detects separation of the carriage 22, the controller 70 actuates the timer 74, and maintains the safe state. Then, the controller 70 continues to maintain the safe state when movement of the shutter 45 from the opened position to the closed position is completed within the certain time (about several seconds) since the start of the measurement of the timer 74. Thus, the controller 70 performs control so as to maintain the safe state while the carriage 22 is separated and thereby, there is no fear that the hand is put in the movable region of the mounting head 31 through the opening 44, with the result that the safer state can be ensured. In addition, the controller 70 determines that trouble occurs in movement of the shutter 45 because the shutter 45 is not moved when movement of the shutter 45 from the opened position to the closed position is not completed within the certain time (about several seconds), and makes a transition to the unsafe state, and stops operation of the mounting head 31.

Next, a procedure for coupling the separated carriage 22 of one side or the other side to the base 11 will be described. When the second detector 72 detects a state in which the carriage 22 is moved in a predetermined position, the controller 70 maintains the safe state. When the second detector 72 detects coupling of the carriage 22, operation of the shutter 45 is started. When the second detector 72 detects coupling of the carriage 22, there is no fear that an operator puts the hand in the movable region of the mounting head 31 through the opening 44 by the carriage 22. As a result, the controller 70 continues to maintain the safe state, and is coupled to the carriage 22 by the operator, and the first detector 71 is coupled to the carriage 22. Thus, the controller 70 performs control so as to maintain the safe state while the carriage 22 is coupled to the base 11 and thereby, operation of the mounting head 31 can be continued.

In addition, the controller 70 determines that trouble occurs in movement of the shutter 45 because the shutter 45 is not moved when movement of the shutter 45 from the closed position to the opened position is not completed within the certain time (about several seconds) using the timer 74. Then, the controller 70 makes a transition from the safe state to the unsafe state, and stops operation of the mounting head 31. Also, when the first detector 71 is not coupled to the carriage 22 within the certain time (about several seconds), it is determined that the carriage 22 is not moved properly, and a transition from the safe state to the unsafe state may be made to stop operation of the mounting head 31.

Also, such a configuration is effective in, for example, the case where a distance between the base 11 and the carriage 22 attached to the base 11 is short and the shutter 45 cannot be moved from the opened position to the closed position with the carriage 22 coupled to the base 11.

The controller 70 may further include an alarm unit configured to have an alarm 75 and an alarm control part 70b (FIG. 9) for detecting that some error occurs when the carriage 22 is separated from the base 11. For example, when some foreign substance is pinched in the shutter 45 and the shutter driving mechanism 46 cannot be operated, the alarm control part 70b receives a signal to the effect that an error occurs from the shutter control part 70a, and actuates the alarm 75 (performs error notification). Also, when the second detector 72 detects that the carriage 22 is not pulled out to the side of the operator to a predetermined position even when the time measured by the timer 74 reaches a preset predetermined time, the alarm control part 70b receives a signal to the effect that an error occurs, and actuates the alarm 75 (performs the error notification).

In the component mounting apparatus 1 in the embodiment as described above, in the case of detaching the carriage 22 from the base 11, the shutter 45 closes the opening 44 formed between the base 11 and the safety cover 36 formed so as to cover an upward side of the base 11 when the mounting head 31 takes the components 3 out of the part feeder 21 attached to the base 11, with the result that even when the cavity is formed in the end of the base 11 by separating the carriage 22 from the base 11, there is no fear that the operator puts the hand in the movable region of the mounting head 31 from its cavity through the opening 44. As a result, operation of the mounting head 31 can be continued while ensuring safety of the operator even when the carriage 22 is separated from the base 11.

This embodiment is illustrative, and it will be apparent to those skilled in the art that combinations of each processing process and their components can have various modified examples and also these modified examples are within the scope of the invention.

A component mounting apparatus capable of continuing operation of a mounting head while ensuring safety of an operator even when a carriage holding a part feeder is separated from a base is provided.

What is claimed is:

1. A component mounting apparatus comprising:
   a carriage that holds a part feeder for supplying a component in a state of being attached to a base and attaches the part feeder to the base in a state of being coupled to the base;
   a mounting head that mounts the component to a substrate after the component is taken out of the part feeder held by the carriage coupled to the base through an opening formed between the base and a cover member formed so as to cover an upward side of the base; and
   a shutter moved from an opened position in which the opening is opened to a closed position in which the opening is closed when the carriage is separated from the base.

2. The component mounting apparatus according to claim 1, wherein the shutter is configured of a plate-shaped member, and is substantially in a horizontal posture in the closed position and substantially in a vertical posture in the opened position.

3. The component mounting apparatus according to claim 2, further comprising:
   a first detecting unit that detects a state in which the carriage is separated from the base; and
   a timer that measures elapsed time when the first detecting unit detects the state in which the carriage is separated from the base,
   wherein operation of the mounting head is stopped when the shutter is not moved from the opened position to the closed position by a lapse of a predetermined time since the timer starts measuring the elapsed time.

4. The component mounting apparatus according to claim 3, further comprising an alarm unit that performs error notification,
   wherein the alarm unit performs the error notification when the shutter is not moved from the opened position to the closed position by the lapse of the predetermined time since the timer starts measuring the elapsed time.

5. The component mounting apparatus according to claim 1, wherein the carriage comprises a first carriage that holds a first part feeder and a second carriage that holds a second part feeder, the first part feeder configured to supply the component with the first carriage coupled to one side of the base, the second part feeder configured to supply the component with the second carriage coupled to the other side opposed to the one side of the base, the shutter comprises a first shutter provided in the one side of the base and a second shutter provided in the other side of the base, when the first carriage is separated from the one side of the base, supply of the component from the second part feeder attached to the second carriage coupled to the other side of the base and mounting operation of the component by the mounting head that takes out the component supplied by the second part feeder and mounts the component to the substrate are continued.

\* \* \* \* \*